(12) United States Patent
Park et al.

(10) Patent No.: US 12,396,225 B2
(45) Date of Patent: Aug. 19, 2025

(54) METHOD TO RELEASE NANO SHEET AFTER NANO SHEET FIN RECESS

(71) Applicant: INTERNATIONAL BUSINESS MACHINES CORPORATION, Armonk, NY (US)

(72) Inventors: Chanro Park, Clifton Park, NY (US); Kangguo Cheng, Schenectady, NY (US); Ruilong Xie, Niskayuna, NY (US); Juntao Li, Cohoes, NY (US); ChoongHyun Lee, Chigasaki (JP)

(73) Assignee: International Business Machines Corporation, Armonk, NY (US)

( * ) Notice: Subject to any disclaimer, the term of this patent is extended or adjusted under 35 U.S.C. 154(b) by 743 days.

(21) Appl. No.: 17/457,686

(22) Filed: Dec. 6, 2021

(65) Prior Publication Data

US 2023/0178602 A1 Jun. 8, 2023

(51) Int. Cl.

| | |
|---|---|
| *H01L 21/02* | (2006.01) |
| *H10D 30/01* | (2025.01) |
| *H10D 30/62* | (2025.01) |
| *H10D 30/67* | (2025.01) |
| *H10D 62/10* | (2025.01) |
| *H10D 64/01* | (2025.01) |

(52) U.S. Cl.
CPC ....... *H10D 62/121* (2025.01); *H10D 30/0243* (2025.01); *H10D 30/62* (2025.01); *H10D 30/6757* (2025.01); *H10D 64/015* (2025.01); *H10D 64/017* (2025.01)

(58) Field of Classification Search
CPC .. H10D 62/121; H10D 30/0243; H10D 30/62; H10D 30/6757; H10D 64/015; H10D 64/017; H10D 30/014; H10D 30/43; H10D 30/6735; B82Y 10/00
See application file for complete search history.

(56) References Cited

U.S. PATENT DOCUMENTS

| | | |
|---|---|---|
| 9,502,518 B2 | 11/2016 | Qing |
| 9,704,863 B1 | 7/2017 | Cheng |
| 9,748,352 B2 | 8/2017 | Liu |
| 9,799,748 B1 | 10/2017 | Xie |
| 9,842,914 B1 | 12/2017 | Yeung |
| 9,923,055 B1 | 3/2018 | Cheng |
| 10,014,390 B1 | 7/2018 | Bouche |
| 10,217,817 B2 | 2/2019 | Chang |
| 10,388,755 B1 | 8/2019 | Lee |
| 10,424,651 B2 | 9/2019 | Cheng |
| 10,651,291 B2 | 5/2020 | Frougier |
| 10,692,991 B2 | 6/2020 | Chanemougame |

(Continued)

*Primary Examiner* — Samuel Park
(74) *Attorney, Agent, or Firm* — Samuel A. Waldbaum

(57) ABSTRACT

A method including forming a plurality of nanosheet layers on a substrate and forming a plurality of first sacrificial layers on the substrate, wherein the plurality of nanosheet layers and the plurality of first sacrificial layers are arranged in alternating layers, where the plurality of first sacrificial layers is comprised of a first material. Selectively removing the plurality of first sacrificial layers and forming a plurality of second sacrificial layers where the plurality of first sacrificial layers were removed, where the plurality of second sacrificial layers is comprised of a second material, where the first material and the second material are different. Recessing the plurality of second sacrificial layers at an even rate.

18 Claims, 8 Drawing Sheets

(56) References Cited

U.S. PATENT DOCUMENTS

| | | | | |
|---|---|---|---|---|
| 10,797,163 | B1* | 10/2020 | Yu | H01L 21/02164 |
| 2019/0341450 | A1* | 11/2019 | Lee | H01L 21/02532 |
| 2019/0348523 | A1* | 11/2019 | Hiblot | B82Y 10/00 |
| 2020/0083352 | A1 | 3/2020 | Chanemougame | |
| 2020/0266060 | A1* | 8/2020 | Cheng | H10D 62/116 |
| 2020/0381426 | A1* | 12/2020 | Xu | H10D 30/014 |
| 2021/0407900 | A1* | 12/2021 | Yu | H10D 64/254 |
| 2022/0367628 | A1* | 11/2022 | Zhu | H10D 30/014 |
| 2023/0067425 | A1* | 3/2023 | Lin | H10D 84/0151 |
| 2023/0147499 | A1* | 5/2023 | Agrawal | H10D 62/822 257/288 |
| 2023/0387198 | A1* | 11/2023 | Liu | H10D 30/6757 |

* cited by examiner

METHOD TO RELEASE NANO SHEET AFTER NANO SHEET FIN RECESS

BACKGROUND

The present invention generally relates to the field of nano devices, and more particularly to forming a recess in a sacrificial layer to allow for the formation of an inner spacer.

A gradient of Si forms in the SiGe channel during the recessing process to create space for the formation of the inner spacer. The Si diffuses into the SiGe layer from the Si nanosheets located above and/or below the SiGe layer. The gradient can cause pathways to be formed through the inner spacer that is formed in the space the SiGe was recessed from. The pathway allows for the etching fluid to travel from the SiGe location to the source/drain epi via the created pathway through the inner spacer. The interaction can lead to damage of the source/drain epi, for example the removal of a portion or all of the source/drain epi.

BRIEF SUMMARY

Additional aspects and/or advantages will be set forth in part in the description which follows and, in part, will be apparent from the description, or may be learned by practice of the invention.

A method including forming a plurality of nanosheet layers on a substrate and forming a plurality of first sacrificial layers on the substrate, wherein the plurality of nanosheet layers and the plurality of first sacrificial layers are arranged in alternating layers, where the plurality of first sacrificial layers is comprised of a first material. Selectively removing the plurality of first sacrificial layers and forming a plurality of second sacrificial layers where the plurality of first sacrificial layers were removed, where the plurality of second sacrificial layers is comprised of a second material, where the first material and the second material are different. Recessing the plurality of second sacrificial layers at an even rate.

A method including forming a plurality of nanosheet layers on a substrate and forming a plurality of first sacrificial layers on the substrate, wherein the plurality of nanosheet layers and the plurality of first sacrificial layers are arranged in alternating layers, where the plurality of first sacrificial layers is comprised of a first material. Selectively removing the plurality of first sacrificial layers and forming a second sacrificial layer where the plurality of first sacrificial layers were removed and the second sacrificial encloses the plurality of nanosheet layers, where the first material and the second material are different. Etching and recessing the second sacrificial layer to form a plurality of second sacrificial layers, where the second sacrificial layer is recessed at an even rate.

A semiconductor device including a plurality of nanosheet layers located on a substrate. At least one inner spacer located below and/or above each of the plurality of nanosheet layers, wherein the at least one spacer has vertical sidewalls that are straight vertical surface. A metal gate located directly adjacent to one of the vertical sidewalls of the inner spacer.

BRIEF DESCRIPTION OF THE DRAWINGS

The above and other aspects, features, and advantages of certain exemplary embodiments of the present invention will be more apparent from the following description taken in conjunction with the accompanying drawings, in which.

DETAILED DESCRIPTION

Figure 1:
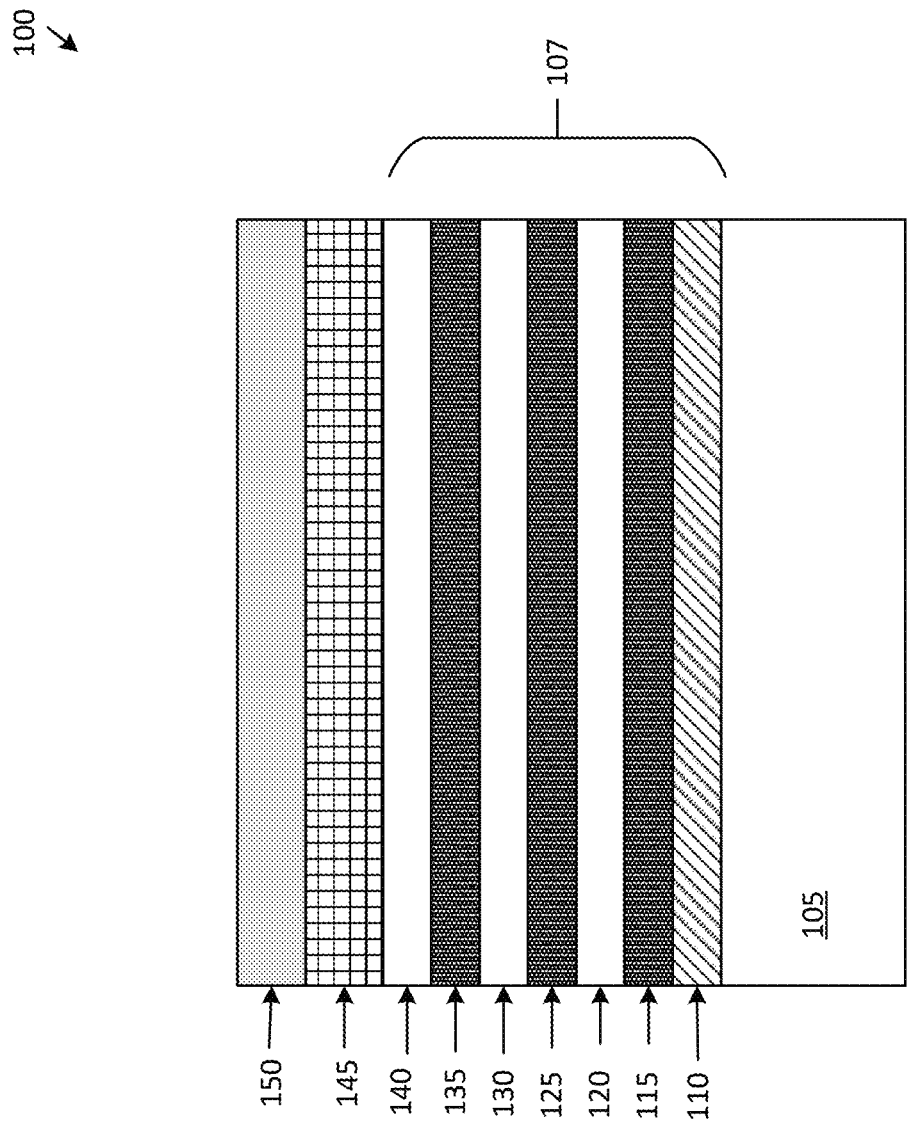
FIG. 1 illustrates a nano stack of a nano device, in accordance with an embodiment of the present invention.

The following description with reference to the accompanying drawings is provided to assist in a comprehensive understanding of exemplary embodiments of the invention as defined by the claims and their equivalents. It includes various specific details to assist in that understanding but these are to be regarded as merely exemplary. Accordingly, those of ordinary skill in the art will recognize that various changes and modifications of the embodiments described herein can be made without departing from the scope and spirit of the invention. In addition, descriptions of well-known functions and constructions may be omitted for clarity and conciseness.

The terms and the words used in the following description and the claims are not limited to the bibliographical meanings but are merely used to enable a clear and consistent understanding of the invention. Accordingly, it should be apparent to those skilled in the art that the following description of exemplary embodiments of the present invention is provided for illustration purpose only and not for the purpose of limiting the invention as defined by the appended claims and their equivalents.

It is understood that the singular forms "a," "an," and "the" include plural referents unless the context clearly dictates otherwise. Thus, for example, reference to "a component surface" includes reference to one or more of such surfaces unless the context clearly dictates otherwise.

Detailed embodiments of the claimed structures and the methods are disclosed herein: however, it can be understood that the disclosed embodiments are merely illustrative of the claimed structures and methods that may be embodied in various forms. This invention may, however, be embodied in many different forms and should not be construed as limited to the exemplary embodiments set forth herein. Rather, these exemplary embodiments are provided so that this disclosure will be thorough and complete and will fully convey the scope of this invention to those skilled in the art. In the description, details of well-known features and techniques may be omitted to avoid unnecessarily obscuring the present embodiments.

References in the specification to "one embodiment," "an embodiment," an example embodiment," etc., indicate that the embodiment described may include a particular feature, structure, or characteristic, but every embodiment may not include the particular feature, structure, or characteristic. Moreover, such phrases are not necessarily referring to the same embodiment. Further, when a particular feature, structure, or characteristic is described in connection with an embodiment, it is submitted that it is within the knowledge of one of ordinary skill in the art to affect such feature, structure, or characteristic in connection with other embodiments whether or not explicitly described.

For purpose of the description hereinafter, the terms "upper," "lower," "right," "left," "vertical," "horizontal," "top," "bottom," and derivatives thereof shall relate to the disclosed structures and methods, as orientated in the drawing figures. The terms "overlying," "atop," "on top," "positioned on," or "positioned atop" mean that a first element, such as a first structure, is present on a second element, such as a second structure, where intervening elements, such as an interface structure may be present between the first element and the second element. The term "direct contact" means that a first element, such as a first structure, and a second element, such as a second structure, are connected without any intermediary conducting, insulating, or semiconductor layer at the interface of the two elements.

In the interest of not obscuring the presentation of embodiments of the present invention, in the following detailed description, some processing steps or operations that are known in the art may have been combined together for presentation and for illustrative purposes and in some instance may have not been described in detail. In other instances, some processing steps or operations that are known in the art may not be described at all. It should be understood that the following description is rather focused on the distinctive features or elements of various embodiments of the present invention.

Various embodiments of the present invention are described herein with reference to the related drawings. Alternative embodiments can be devised without departing from the scope of this invention. It is noted that various connections and positional relationships (e.g., over, below, adjacent, etc.) are set forth between elements in the following description and in the drawings. These connections and/or positional relationships, unless specified otherwise, can be direct or indirect, and the present invention is not intended to be limiting in this respect. Accordingly, a coupling of entities can refer to either a direct or indirect coupling, and a positional relationship between entities can be direct or indirect positional relationship. As an example of indirect positional relationship, references in the present description to forming layer "A" over layer "B" includes situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains," or "containing" or any other variation thereof, are intended to cover a non-exclusive inclusion. For example, a composition, a mixture, process, method, article, or apparatus that comprises a list of elements is not necessarily limited to only those elements but can include other element not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiment or designs. The terms "at least one" and "one or more" can be understood to include any integer number greater than or equal to one, i.e., one, two, three, four, etc. The terms "a plurality" can be understood to include any integer number greater than or equal to two, i.e., two, three, four, five, etc. The term "connection" can include both indirect "connection" and a direct "connection."

As used herein, the term "about" modifying the quantity of an ingredient, component, or reactant of the invention employed refers to variation in the numerical quantity that can occur, for example, through typical measuring and liquid handling procedures used for making concentrations or solutions. Furthermore, variation can occur from inadvertent error in measuring procedures, differences in manufacture, source, or purity of the ingredients employed to make the compositions or carry out the methods, and the like. The terms "about" or "substantially" are intended to include the degree of error associated with measurement of the particular quantity based upon the equipment available at the time of the filing of the application. For example, about can include a range of ±8%, or 5%, or 2% of a given value. In another aspect, the term "about" means within 5% of the reported numerical value. In another aspect, the term "about" means within 10, 9, 8, 7, 6, 5, 4, 3, 2, or 1% of the reported numerical value.

Various process used to form a micro-chip that will packaged into an integrated circuit (IC) fall in four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE), and more recently, atomic layer deposition (ALD) among others. Removal/etching is any process that removes material from the wafer. Examples include etching process (either wet or dry), reactive ion etching (RIE), and chemical-mechanical planarization (CMP), and the like. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implant dopants. Films of both conductors (e.g., aluminum, copper, etc.) and insulators (e.g., various forms of silicon dioxide, silicon nitride, etc.) are used to connect and isolate electrical components. Selective doping of various regions of the semiconductor substrate allows the conductivity of the substrate to be changed with the application of voltage.

Reference will now be made in detail to the embodiments of the present invention, examples of which are illustrated in the accompanying drawings, where like reference numerals refer to like elements throughout. When recessing the sacrificial layers, which are comprised of SiGe where Ge is in the range of about 15% to 35%, a Si gradient is formed in the sacrificial layer. Si diffuses from the channel layers, which are comprised of Si, into the sacrificial layer during a high temperature annealing process that is used during the recessing step. Thus, when the sacrificial layer is recessed, the gradient changes how the sacrificial layer interacts with the etching process. The gradient causes the sacrificial layers to be recessed int an elliptical pattern, meaning that the center of the sacrificial layer is recessed more than the parts closer to the channel layers. Some of the sacrificial material closer to the channel layers could remain after the recessing process, thus preventing the inner spacer from completely filling the recessed area. The not completely removed sacrificial material can create a pathway through the inner spacer between the source/drain epi and the sacrificial layer. So, when the sacrificial material is removed, the etching fluid can travel through the created pathway to interact with the source/drain material. The etching material negatively interacts with the source/drain material, such that, the etching material can remove a portion or all of the source/drain material.

The present invention solves this issue by substituting the typical sacrificial material of SiGe for a different sacrificial material. The sacrificial material SiGe is still utilized when forming the alternating layers of Si and SiGe. The SiGe layers allows for epitaxially growing the channel layers comprised of Si. After the nano stack is formed and the initial processing steps to form the nano device, the sacrificial layers comprised of SiGe are removed and replaced. The SiGe is replaced with another sacrificial material that is comprised of a material that can be selectively removed by SiN, SiBCN, SiCO and can be deposited at a low temperature (<400° C.). The new sacrificial material can be, for example, BN, carbon, a-Si:H, $SiO_2$, or another suitable material. The new sacrificial layer can be recessed without a Si gradient forming, thus allowing the formation of the inner spacer without any pathways of sacrificial material being formed.

FIG. 1 illustrates a nano stack 107 of a nano device 100, in accordance with an embodiment of the present invention. The nano device 100 includes a substrate 105, a nano stack 107, a dummy gate 145, and a hardmask 150. The substrate 105 can be, for example, a material including, but not necessarily limited to, silicon (Si), silicon germanium (SiGe), silicon carbide (SiC), Si:C (carbon doped silicon), silicon germanium carbide (SiGeC), carbon doped silicon germanium (SiGe:C), III-V, II-V compound semiconductor or another like semiconductor. In addition, multiple layers of the semiconductor materials can be used as the semiconductor material of the substrate 105. In some embodiments, the substrate 105 includes both semiconductor materials and dielectric materials. The semiconductor substrate 105 may also comprise an organic semiconductor or a layered semiconductor such as, for example, Si/SiGe, a silicon-on-insulator or a SiGe-on-insulator. A portion or entire semiconductor substrate 105 may also be comprised of an amorphous, polycrystalline, or monocrystalline. The semiconductor substrate 105 may be doped, undoped or contain doped regions and undoped regions therein. The nano stack 107 includes a first layer 110, a second layer 115, a third layer 120, a fourth layer 125, a fifth layer 130, a sixth layer 135, and a seventh layer 140. The first layer 110 can be comprised of, for example, SiGe, where Ge is in the range of about 45% to 70%. The nano stack 107 includes a group of sacrificial layers comprised of the second layer 115, the fourth layer 125, the sixth layer 135. Each of the sacrificial layers can be comprised of, for example, SiGe, where Ge is in the range of about 15% to 35%. The nano stack 107 includes a group of channel layers comprised of, for example, the third layer 120, the fifth layer 130, and the seventh layer 140. Each of the channel layers can be comprised of, for example, Si. The group of sacrificial layers needs to be initially comprised of SiGe because the channel layer is epitaxially grown to allow the channels to have the desired crystalline structure orientation. The dummy gate 145 is formed on top of the seventh layer 140 and a hardmask 150 is formed on top of the dummy gate 145.

Figure 2:
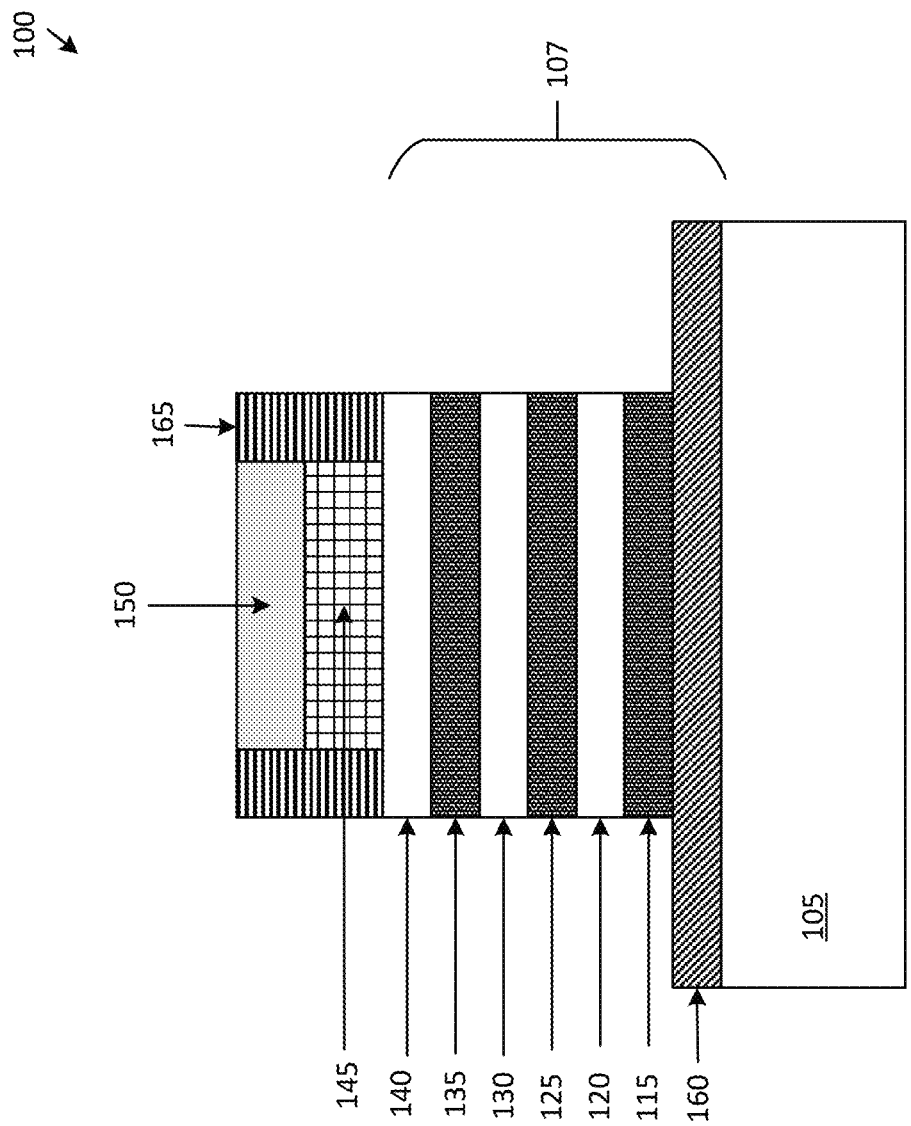
FIG. 2 illustrates the nano device after processing of the nano stack, in accordance with an embodiment of the present invention.

FIG. 2 illustrates the nano device 100 after processing of the nano stack 107, in accordance with an embodiment of the present invention. The first layer 110 is selectively removed and replaced with a bottom dielectric layer 160. The hardmask 150 is patterned and the nano stack 107 and the dummy gate 145 is etched. A top spacer 165 is formed on the exposed surfaces and the top spacer 165 is etched back. A portion of the top spacer 165 remains located adjacent to the side walls of the dummy gate 145 and the hardmask 150.

Figure 3:
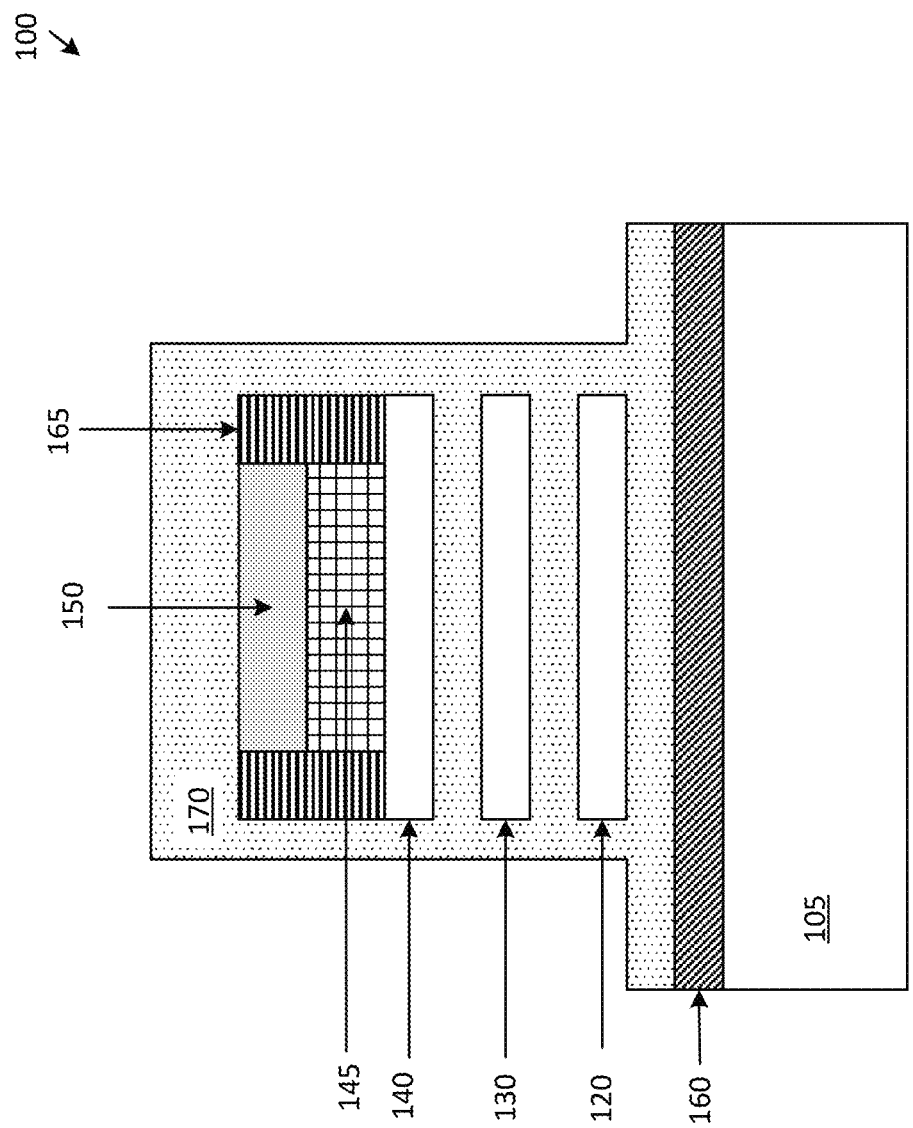
FIG. 3 illustrates the nano device after replacing the materials of the sacrificial layers, in accordance with an embodiment of the present invention.

FIG. 3 illustrates the nano device 100 after replacing the materials of the sacrificial layers, in accordance with an embodiment of the present invention. The group of sacrificial layers comprised of the second layer 115, the fourth layer 125, the sixth layer 135 are selectively removed. A new sacrificial layer 170 is formed on all the exposed surfaces. The new sacrificial layer 170 encloses the third layer 120, the fifth layer 130, and the seventh layer 140 if a sacrificial layer was located on top of the seventh layer 140, which was not shown in the figures. FIG. 3 illustrates that the new sacrificial layer 170 is located on three sides of the seventh layer 140 since the dummy gate 145 and the top spacer 165 are located on top of the seventh layer 140. The new sacrificial layer 170 is comprised of a material that can be selectively removed by SiN, SiBCN, SiCO and can be deposited at a low temperature (<400° C.). The new sacrificial material can be, for example, BN, carbon, a-Si:H, SiO2, or another suitable material.

Figure 4:
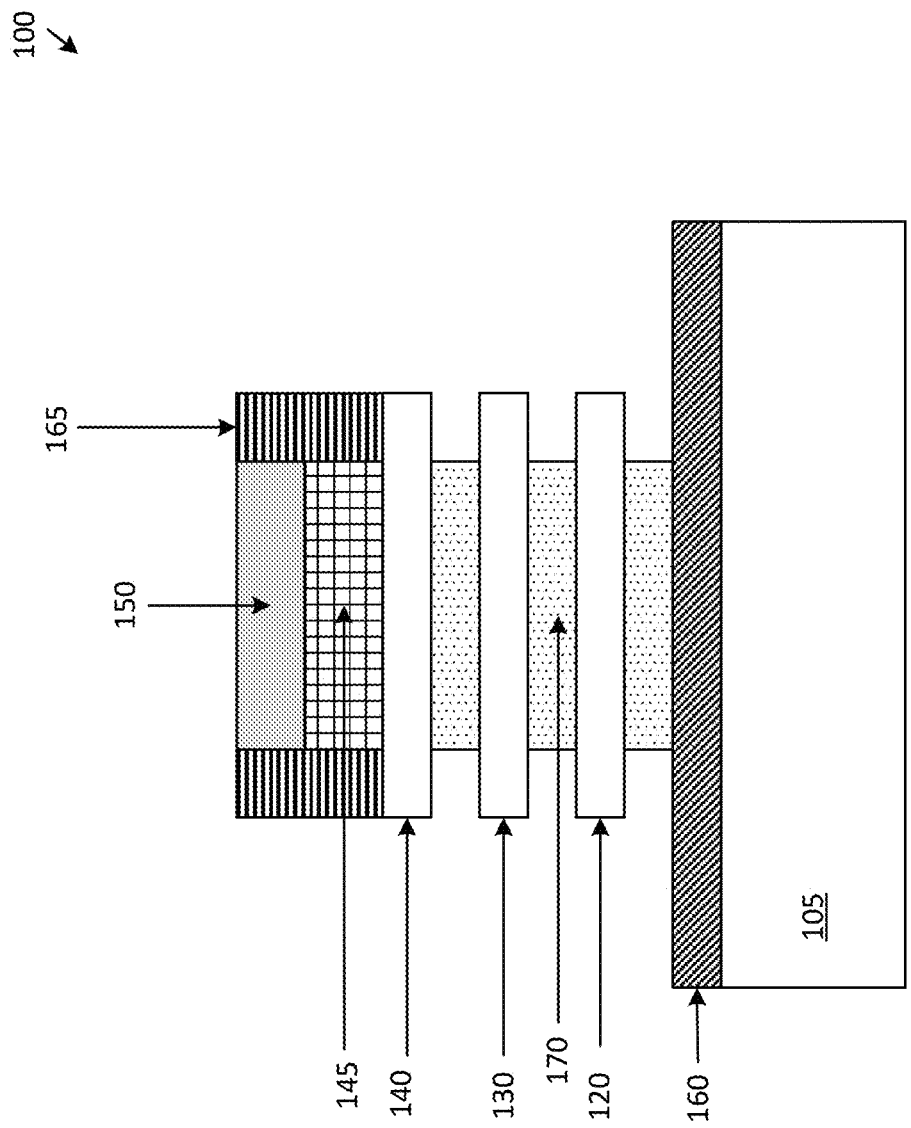
FIG. 4 illustrates the nano device after etching of the new sacrificial layer, in accordance with an embodiment of the present invention.

FIG. 4 illustrates the nano device 100 after etching of the new sacrificial layer 170, in accordance with an embodiment of the present invention. The new sacrificial layer 170 is etched by, for example, isotropic wet or dry etching, to remove excess material located on top of the bottom dielectric layer 160, on top of the hardmask 150, on top of the top spacer 165, and excess material that extends up the side walls of the nano stack 107. The new sacrificial layer 170 that is located between the bottom dielectric layer 160 and the third layer 120 is recessed so that only a portion of the new sacrificial layer 170 remains at this location. The new sacrificial layer 170 located between the third layer 120 and the fifth layer 130 is recessed so that only a portion of the new sacrificial layer 170 remains at this location. The new sacrificial layer 170 located between the fifth layer 130 and the seventh layer 140 is recessed so that only a portion of the new sacrificial layer 170 remains at this location. A gradient of Si is prevented from being formed in the new sacrificial layer 170 during the recessing process. Since a gradient is not present in the new sacrificial layer 170, then the new sacrificial layer 170 is recessed at an even rate. This allows for the even removal/recess of the new sacrificial layer 170. The sidewall of each of the new sacrificial layers 170 forms straight vertical surface since the new sacrificial layer 170 was recessed at an even rate across it surface.

Figure 5:
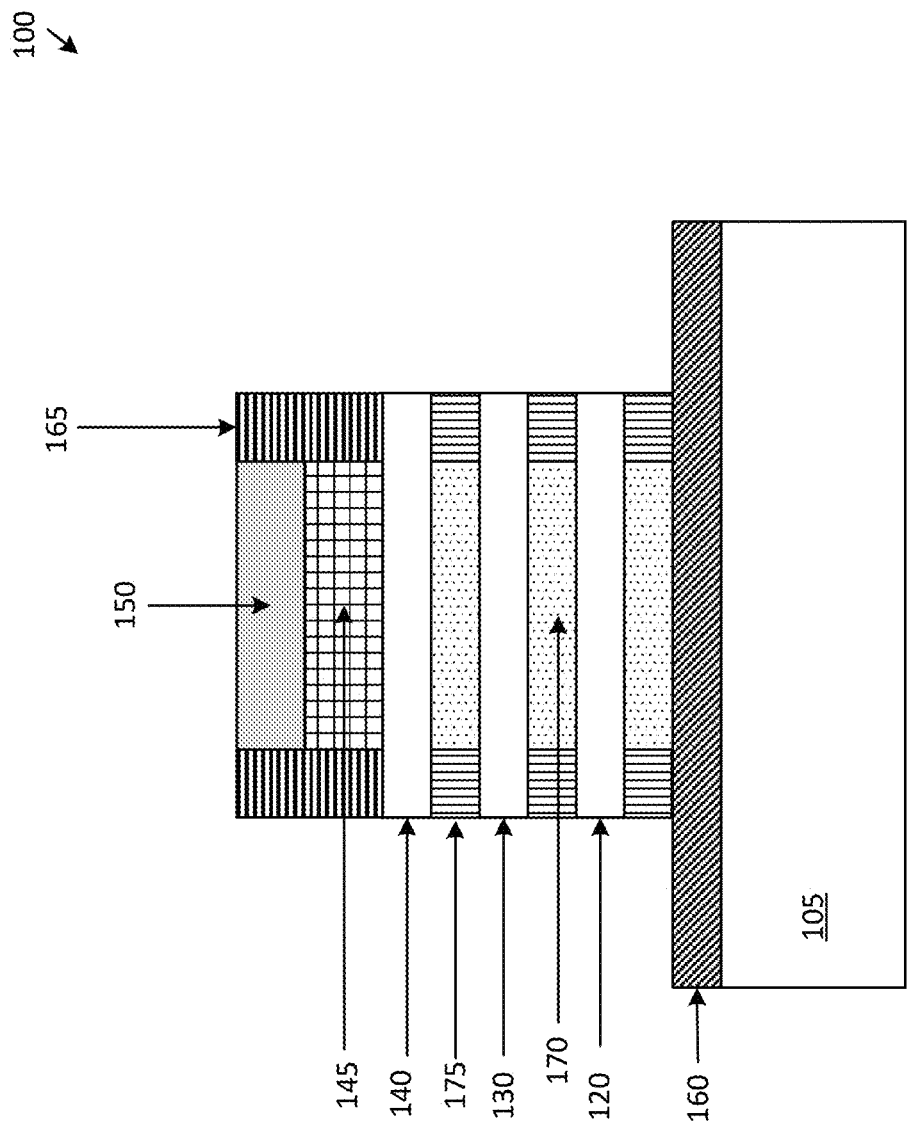
FIG. 5 illustrates the nano device after formation of the inner spacer, in accordance with an embodiment of the present invention.

FIG. 5 illustrates the nano device 100 after formation of the inner spacer 175, in accordance with an embodiment of the present invention. An inner spacer 175 is formed in the spaced created by the recessing of the new sacrificial layer 170. Since the new sacrificial layer 170 is recessed at an even rate across its height, it allows for the inner spacer 175 be in direct contact with the layer located above and below the inner spacer 170. Since the new sacrificial layer 170 was recessed evenly back, then there is no residual sacrificial material located between the inner spacer 175 and the above/below nanosheet layer. The lack of there being no residual sacrificial material located between the inner spacer 175 and the above/below nanosheet layer prevents any pathways forming across the inner spacer 175 during the etching process to remove the new sacrificial layer 170. The inner spacer 175 includes a straight vertical sidewall that is directly adjacent to the sidewall of the new sacrificial layer 170. At least one of the horizontal surfaces of the inner spacer 175 is in direct continuous contact along its horizontal surface with one of the nanosheets (e.g., the third layer 120, the fifth layer 130, or the seventh layer 140).

Figure 6:
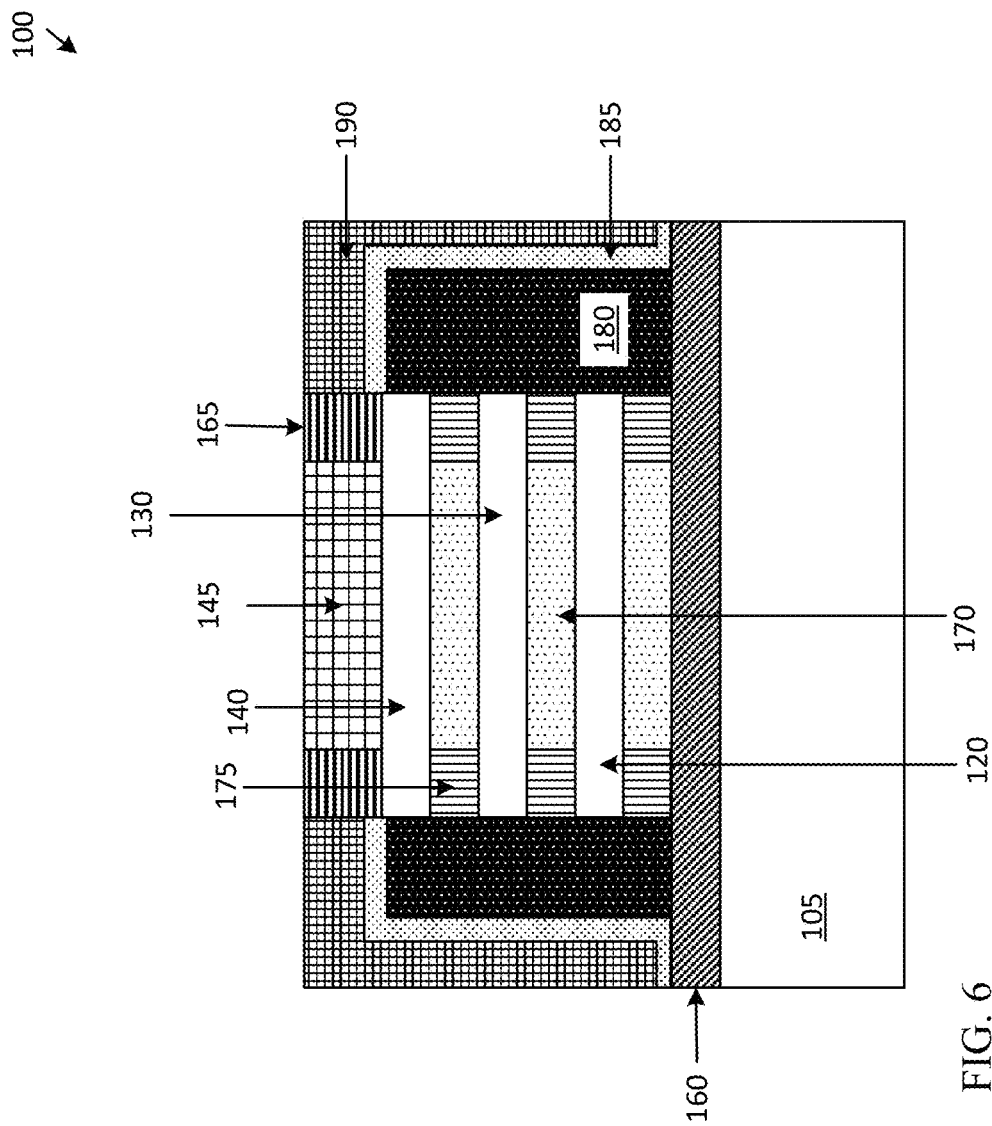
FIG. 6 illustrates the nano device after the formation of the source/drain epi, in accordance with an embodiment of the present invention.

FIG. 6 illustrates the nano device 100 after the formation of the source/drain epi 180, in accordance with an embodiment of the present invention. A source/drain epi 180 is formed on the sidewall of the nano stack 107. The source/drain epi 180 extends up from the bottom dielectric layer 160 to above the seventh layer 140. The source/drain epi 180 can be for example, a n-type epi, or a p-type epi. For n-type epi, an n-type dopant selected from a group of phosphorus (P), arsenic (As) and/or antimony (Sb) can be used. For p-type epi, a p-type dopant selected from a group of boron (B), gallium (Ga), indium (In), and/or thallium (Tl) can be used. Other doping techniques such as ion implantation, gas phase doping, plasma doping, plasma immersion ion implantation, cluster doping, infusion doping, liquid phase doping, solid phase doping, and/or any suitable combination of those techniques can be used. In some embodiments, dopants are activated by thermal annealing such as laser annealing, flash annealing, rapid thermal annealing (RTA) or any suitable combination of those techniques. A liner 185 is formed on the exposed surfaces of the source/drain epi 180 and on top of the bottom dielectric layer 160. The liner 185 can be comprised of, for example, SiN. An interlayer dielectric layer (ILD) 190 is formed on top of the liner 185. The nano device 100 is planarized by, for example, chemical mechanical planarization (CMP) to remove the hard mask 150, portions of the top spacer 165, and portions of the ILD 190.

Figure 7:
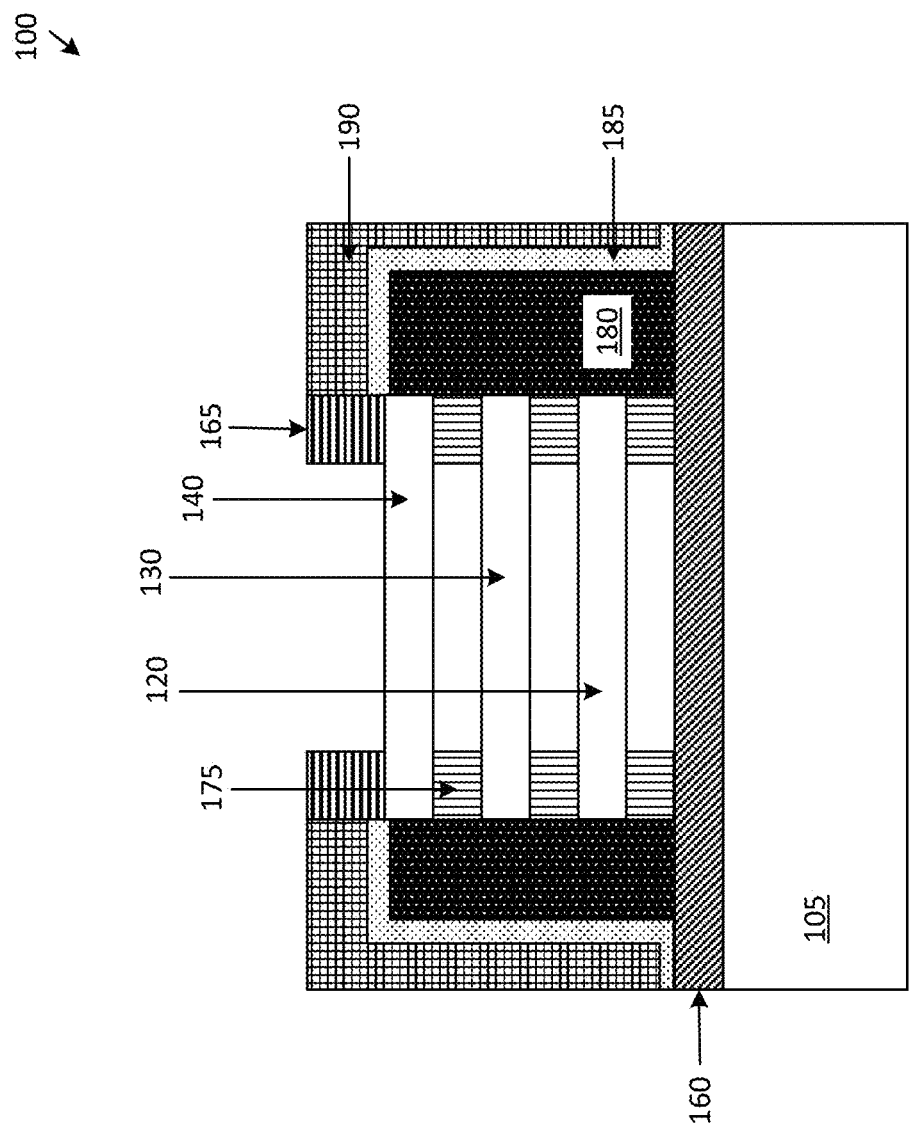
FIG. 7 illustrates the nano device after removal of the new sacrificial layer, in accordance with an embodiment of the present invention.

FIG. 7 illustrates the nano device 100 after removal of the new sacrificial layer 170, in accordance with an embodiment of the present invention. The dummy gate 145 and the new sacrificial layer 170 are removed to create empty spaces for the formation of the gate 195. Since there are no pathways in the inner spacer 175, the source/drain epi 180 is not damaged during the removal of the new sacrificial layer 170.

Figure 8:
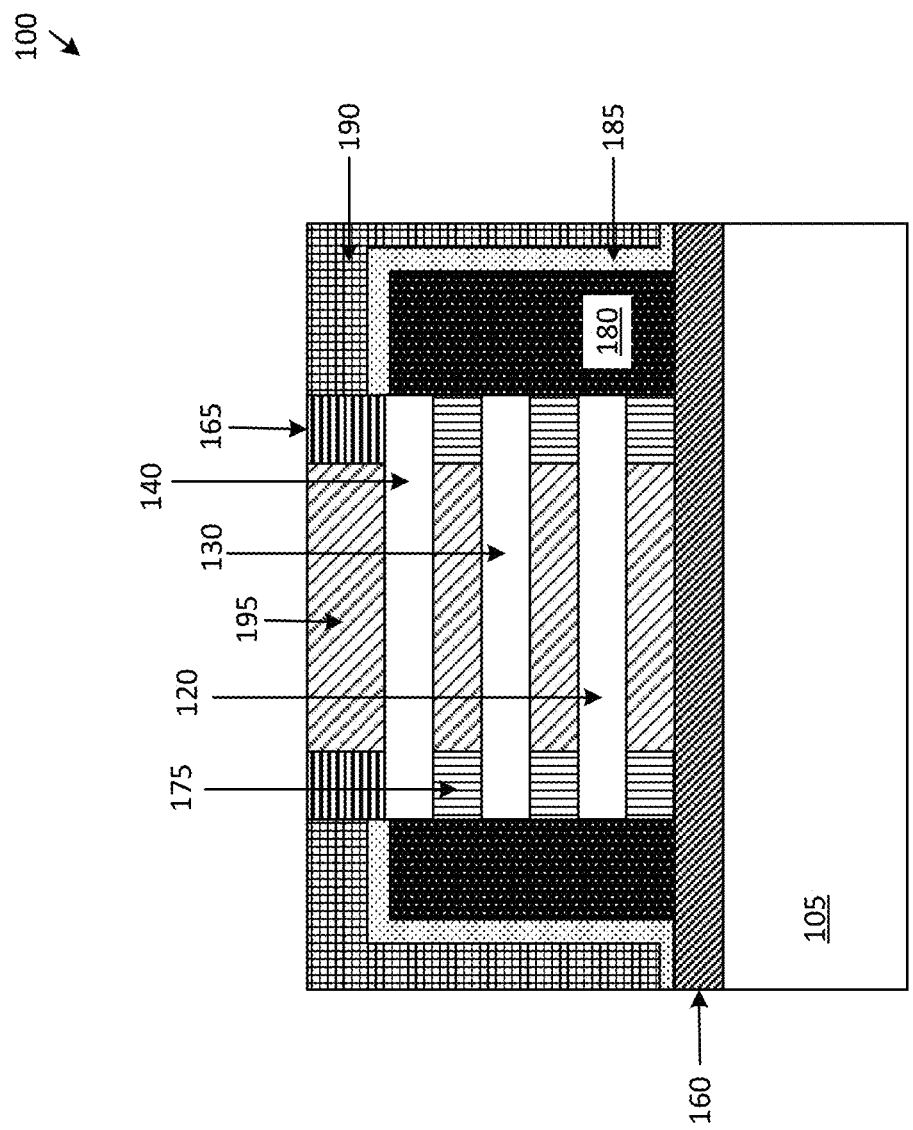
FIG. 8 illustrates the nano device after formation of the gate, in accordance with an embodiment of the present invention.

FIG. 8 illustrates the nano device 100 after formation of the gate 195, in accordance with an embodiment of the present invention. The gate 195 is formed in the location where the dummy gate 145 and the new sacrificial layer 170 were located. The gate 195 can be comprised of, for example, a gate dielectric liner, such as high-k dielectric like $HfO_2$, $ZrO_2$, $HfL_aO_x$, etc., and work function layers, such as TiN, TiAlC, TiC, etc., and conductive metal fills, like W.

While the invention has been shown and described with reference to certain exemplary embodiments thereof, it will be understood by those skilled in the art that various changes in form and details may be made therein without departing from the spirit and scope of the present invention as defined by the appended claims and their equivalents.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the one or more embodiment, the practical application or technical improvement over technologies found in the marketplace, or to enable others of ordinary skill in the art to understand the embodiments disclosed herein.

What is claimed is:

1. A method comprising:
    forming a plurality of nanosheet layers on a substrate;
    forming a plurality of first sacrificial layers on the substrate, wherein the plurality of nanosheet layers and the plurality of first sacrificial layers are arranged in alternating layers, wherein the plurality of first sacrificial layers is comprised of a first material;
    selectively removing the plurality of first sacrificial layers;
    forming a plurality of second sacrificial layers where the plurality of first sacrificial layers were removed, wherein the plurality of second sacrificial layers is comprised of a second material, wherein the first material and the second material are different; and
    recessing the plurality of second sacrificial layers at an even rate.

2. The method of claim 1, wherein the plurality of second sacrificial layer is recessed at an even rate.

3. The method of claim 2, wherein after the recessing the plurality of second sacrificial layers a sidewall of each of plurality of sacrificial layers forms a straight vertical surface.

4. The method of claim 1, wherein the first material is SiGe.

5. The method of claim 1, wherein the second material is a material that can be selectively removed by SiN, SiBCN, SiCO and can be deposited at a low temperature (<400° C.).

6. The method of claim 5, wherein the second material is selected from a group consisting of BN, carbon, a-Si:H, SiO2, or another suitable material.

7. The method of claim 1, further comprising:
    forming an inner spacer on each of the plurality of nanosheets where the plurality of second sacrificial layers was recessed.

8. The method of claim 7, wherein the inner spacer has vertical sidewalls that are straight vertical surface.

9. The method of claim 8, wherein the vertical sidewall of the inner spacer is directly adjacent to a straight vertical sidewall of one of the plurality of second sacrificial layers.

10. A method comprising:
    forming a plurality of nanosheet layers on a substrate;
    forming a plurality of first sacrificial layers on the substrate, wherein the plurality of nanosheet layers and the plurality of first sacrificial layers are arranged in alternating layers, wherein the plurality of first sacrificial layers is comprised of a first material;
    selectively removing the plurality of first sacrificial layers;
    forming a second sacrificial layer where the plurality of first sacrificial layers were removed and the second sacrificial encloses the plurality of nanosheet layers, wherein the second sacrificial layer is comprised of a second material, wherein the first material and the second material are different;
    etching and recessing the second sacrificial layer to form a plurality of second sacrificial layers, wherein the second sacrificial layer is recessed at an even rate.

11. The method of claim 10, wherein the plurality of second sacrificial layer is recessed at an even rate.

12. The method of claim 11, wherein after the recessing the plurality of second sacrificial layers a sidewall of each of plurality of sacrificial layers forms a straight vertical surface.

13. The method of claim 10, wherein the first material is SiGe.

14. The method of claim 10, wherein the second material is a material that can be selectively removed by SiN, SiBCN, SiCO and can be deposited at a low temperature (<400° C.).

15. The method of claim 14, wherein the second material is selected from a group consisting of BN, carbon, a-Si:H, SiO2, or another suitable material.

16. The method of claim 10, further comprising:
   forming an inner spacer on each of the plurality of nanosheets where the plurality of second sacrificial layers was recessed.

17. The method of claim 16, wherein the inner spacer has vertical sidewalls that are straight vertical surface.

18. The method of claim 17, wherein the vertical sidewall of the inner spacer is directly adjacent to a straight vertical sidewall of one of the plurality of second sacrificial layers.

* * * * *